United States Patent
Norikane et al.

(10) Patent No.: US 7,141,117 B2
(45) Date of Patent: Nov. 28, 2006

(54) METHOD OF FIXING SEED CRYSTAL AND METHOD OF MANUFACTURING SINGLE CRYSTAL USING THE SAME

(75) Inventors: Tetsuya Norikane, Imabari (JP); Hiroaki Hoshikawa, Niihama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/044,679

(22) Filed: Jan. 27, 2005

(65) Prior Publication Data
US 2005/0166833 A1   Aug. 4, 2005

(30) Foreign Application Priority Data
Feb. 4, 2004   (JP) .............................. 2004-027645

(51) Int. Cl.
C30B 25/12 (2006.01)
C30B 25/14 (2006.01)

(52) U.S. Cl. ........................... 117/105; 117/89; 117/95; 117/107

(58) Field of Classification Search .................. 117/89, 117/94, 95, 105, 107
See application file for complete search history.

(56) References Cited

U.S. PATENT DOCUMENTS

| | | | |
|---|---|---|---|
| 5,944,890 A | 8/1999 | Kitou et al. | |
| 6,514,338 B1 * | 2/2003 | Shigeto et al. | 117/84 |
| 6,797,060 B1 * | 9/2004 | Shigeto et al. | 117/200 |

FOREIGN PATENT DOCUMENTS

| | | |
|---|---|---|
| JP | 9-110584 | 4/1997 |
| JP | 9-268096 | 10/1997 |

* cited by examiner

Primary Examiner—Felisa Hiteshew
(74) Attorney, Agent, or Firm—Hamre, Schumann, Mueller & Larson, P.C.

(57) ABSTRACT

A method of fixing a seed crystal to be used for growing a silicon carbide single crystal from the seed crystal that has been fixed to a graphite base, wherein the method includes: forming a layered product by placing a metallic material whose melting point is not higher than growth temperature of the single crystal on the graphite base, disposing the seed crystal on the metallic material, and then further placing a pressing member for imposing a load on the seed crystal thereon; heat-treating the layered product at a temperature to fix the graphite base, the metallic material, and the seed crystal to each other to form one body, with the temperature being not lower than the melting point of the metallic material but not higher than the growth temperature of the single crystal; cooling the layered product; and then removing the pressing member from the layered product. The present invention provides a method of fixing a seed crystal to be used for growing a silicon carbide single crystal that inhibits the development of macroscopic defects to extend in a grown single crystal by bonding the seed crystal and a graphite base for holding the seed crystal to each other with a metal carbide layer including no voids. The present invention also provides a method of manufacturing a single crystal using the fixing method.

23 Claims, 7 Drawing Sheets

METHOD OF FIXING SEED CRYSTAL AND METHOD OF MANUFACTURING SINGLE CRYSTAL USING THE SAME

BACKGROUND OF THE INVENTION

1. Field of the Invention

The present invention relates generally to a fixing method for fixing a seed crystal to be used for growing a single crystal of, for instance, silicon carbide to a graphite base, and a method of manufacturing a single crystal using the same.

2. Related Background Art

Recently, a silicon carbide single crystal substrate has been developed as a semiconductor substrate for high withstand voltage and high power semiconductor devices such as high withstand voltage and power transistors, high withstand voltage diodes, etc. A sublimation-recrystallization method (the improved Reilly method) mainly is employed as the method of manufacturing the silicon carbide single crystal substrate. FIG. 5 is a schematic view of an apparatus that is used in the sublimation-recrystallization method. A graphite crucible including a container 14 and a lid 15 provided with a base contains SiC powder 16 as raw material powder in its lower half while a seed crystal 17 is placed on the lower surface of the lid 15 facing the SiC powder. The inside of the crucible is maintained with a higher temperature on the SiC powder 16 side and a lower temperature on the seed crystal 17 side. Sublimated gas of the SiC powder 16 recrystallizes on the seed crystal 17 having a lower temperature and thereby a single crystal 18 grows.

In the above-mentioned method, the seed crystal 17 generally is attached to the base provided for the lid 15 using an adhesive. In that case, however, as shown in FIG. 6A, a heat treatment process for drying and curing the adhesive tends to cause air bubbles to be generated in an adhesive layer 19 and thereby voids 20 may remain in the adhesive layer 19. When a single crystal is grown in the presence of the voids 20, heat is conducted to the lid 15 from regions of the seed crystal 17 that closely adhere to the adhesive layer 19 and are not in contact with the voids 20. This results in no temperature gradient produced between the seed crystal 17 and the lid 15. The seed crystal 17, however, does not allow heat to escape to the lid 15 in its regions that are in contact with the voids 20, which results in a temperature gradient produced locally between the seed crystal 17 and the lid 15.

As a result, as shown in FIG. 6B, the seed crystal 17 sublimates from the rear face of the seed crystal 17 to the lid 15 having a lower temperature through the voids 20. Such rear face sublimation that is caused from the rear face of the seed crystal 17 occurs in a plurality of locations in the plane at which the seed crystal 17 and the lid 15 are attached to each other, and it continues during single crystal growth. Accordingly, as shown in FIG. 6C, large defects (macroscopic defects) 21 that propagate in the growth direction from the interface between the seed crystal 17 and the base are caused. The presence of these macroscopic defects 21 not only causes difficulty in cutting out a large number of usable SiC wafers even when a long SiC single crystal is obtained, but also may cause hollow penetration defects called "micro-pipes", with the macroscopic defects 21 being used as originating points. Hence, there is a problem that it is difficult to obtain a high-quality SiC single crystal with a large area.

In order to solve this problem, for instance, a method of allowing a seed crystal to have a uniform in-plane temperature distribution has been proposed that is carried out by joining a seed crystal and a base of a lid to each other, with a carbonized layer being interposed therebetween (see JP9 (1997)-110584A; Patent Document 1). This configuration is the same as that shown in FIGS. 6A to 6C except that the adhesive layer 19 is replaced by the carbonized layer 22. Hence, the illustration thereof is omitted. Furthermore, a method of inhibiting the development of macroscopic defects has been proposed that is carried out by coating the surfaces of the seed crystal, other than the surface on which a single crystal grows, with a protective layer formed of a material (for instance, tantalum) that is stable under single crystal growth conditions, and then joining the seed crystal to a base of a lid with an adhesive (see JP9(1997)-268096A; Patent Document 2).

In the method described in Patent Document 1, however, a liquid adhesive (for instance, a resist) containing a polymeric material is provided between the seed crystal 17 and the base of the lid 15 and then is heat-treated at high temperature to form the carbonized layer 22 therebetween to fix the seed crystal 17. Accordingly, voids 20 tend to be produced due to air bubbles generated by the heat treatment process. As a result, the development of the macroscopic defects 21 cannot be inhibited completely as in the case shown in FIG. 6C.

Similarly, in the method described in Patent Document 2, as shown in FIGS. 7A to 7C, unevenness of the adhesive layer 19 causes local temperature distribution. As a result, cracks 24 are caused in the protective layer 23 and thereby the rear face sublimation occurs through the cracks 24 between the seed crystal 17 and the surface of the base of the lid 15 to which the adhesive layer 19 adheres. This produces macroscopic defects 21, which has been a problem.

SUMMARY OF THE INVENTION

Hence, the present invention is intended to solve the above-mentioned conventional problems and to provide a method of fixing a seed crystal to be used for growing a single crystal, wherein rear face sublimation is prevented from occurring between the rear face of the seed crystal and a base and the development of macroscopic defects that extend in a grown crystal can be inhibited with more certainty. The present invention also is intended to provide a method of manufacturing a single crystal using a seed crystal obtained by the above-mentioned fixing method.

The method of fixing a seed crystal according to the present invention is a method of fixing a seed crystal to be used for growing a silicon carbide single crystal from the seed crystal that has been fixed to a graphite base. The method is characterized in including: forming a layered product by placing a metallic material whose melting point is not higher than a growth temperature of the single crystal on the graphite base, disposing the seed crystal on the metallic material, and then further placing a pressing member for imposing a load on the seed crystal thereon; heat-treating the layered product at a temperature to fix the graphite base, the metallic material, and the seed crystal to each other to form one body, with the temperature being not lower than the melting point of the metallic material but not higher than the growth temperature of the single crystal; cooling the layered product; and then removing the pressing member from the layered product.

Another method of fixing a seed crystal according to the present invention is a method of fixing a seed crystal to be used for growing a silicon carbide single crystal from the seed crystal that has been fixed to a graphite base. The method is characterized by including: forming a layered product by placing a metallic material whose melting point is not higher than a growth temperature of the single crystal on the graphite base, disposing the seed crystal on the metallic material, and then further placing a pressing member for imposing a load on the seed crystal thereon; heat-treating the layered product, with a container for covering the layered product being disposed on the graphite base, so that a lower portion of the graphite base has a temperature that is not lower than the melting point of the metallic material but is not higher than the growth temperature of the single crystal while the difference in temperature caused between the lower portion of the graphite base and an upper portion of the container is adjusted, and thereby fixing the graphite base, the metallic material, and the seed crystal to each other to form one body; cooling the container and the layered product; and then removing the container and the pressing member from the layered product.

A method of manufacturing a single crystal of the present invention is characterized by using a seed crystal fixed by the fixing method described above in growing a silicon carbide single crystal on the seed crystal by supplying sublimation gas generated from a silicon carbide raw material onto the seed crystal held by a graphite base.

According to the method of fixing a seed crystal and the method of manufacturing a single crystal using the fixing method according to the present invention, an adhesive layer made of metal carbide is formed between a seed crystal and a graphite base for holding the seed crystal and thereby no voids are produced between the seed crystal and the graphite base at a high temperature that is employed in growing a single crystal. Thus, macroscopic defects extending from the rear face of the seed crystal can be prevented from developing in the single crystal and thereby a high-quality silicon carbide single crystal can be obtained.

DETAILED DESCRIPTION OF THE INVENTION

Figure 1A:
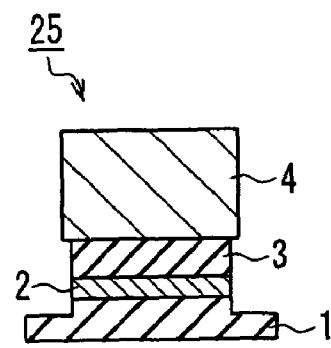
FIGS. 1A to 1C are cross sectional views showing a method of fixing a seed crystal to be used for growing a single crystal according to Example 1 of the present invention.

In the present invention, it is preferable that the metallic material be at least one material selected from the group consisting of titanium, vanadium, and zirconium. With these metallic materials, a metal carbide layer can be formed that bonds the seed crystal including no voids and the graphite base to each other. Thereby the sublimation can be prevented from occurring from the rear face of the seed crystal, and the development of macroscopic defects that extend in the grown single crystal can be inhibited.

Preferably, the metallic material has a thickness in the range of 20 μm to 200 μm. This thickness range allows a sufficiently high adhesive strength to be obtained and makes it possible to prevent a molten metal from spreading onto the seed crystal surface. Accordingly, micro-pipe defects can be prevented from developing using, as their nuclei, the metal that has adhered to the seed crystal surface, and contamination of the single crystal to be grown with the metal can be prevented.

Preferably, in the case of using titanium as the metallic material, the heat-treating process employs a heating temperature in the range of 1700° C. to 2000° C. When the heating temperature is in this range, titanium melts and thereby the graphite base and the seed crystal can be fixed to each other to form one body.

Preferably, in the case of using vanadium as the metallic material, the heat-treating process employs a heating temperature in the range of 1900° C. to 2200° C. When the heating temperature is in this range, vanadium melts and thereby the graphite base and the seed crystal can be fixed to each other to form one body.

Preferably, in the case of using zirconium as the metallic material, the heat-treating process employs a heating temperature in the range of 1900° C. to 2200° C. When the heating temperature is in this range, zirconium melts and thereby the graphite base and the seed crystal can be fixed to each other to form one body.

Preferably, the heat-treating process employs a heating time in the range of 1 to 6 hours. When this reaction time is employed, graphite of the graphite base surface and the metallic material react with each other and thereby the metal carbide layer whose melting point is not lower than the growth temperature of the single crystal can be formed efficiently.

It is preferable that the pressing member have a weight that allows a pressure of 7.84 kPa to 87.5 kPa to be imposed on the seed crystal. In this case, the graphite of the graphite base surface and the metallic material are allowed to adhere to each other to react with each other uniformly and thereby the metal carbide layer can be formed efficiently.

Preferably, the pressing member is formed of at least one material selected from the group consisting of graphite, tantalum, niobium, molybdenum, tantalum carbide, niobium carbide, and molybdenum carbide. This is because such a pressing member does not melt at the heating temperature and therefore does not contaminate the surface of the seed crystal.

It is preferable that the cooling process be carried out by lowering the temperature employed in the heat-treating process to 1100° C. at a rate of 5 to 15° C./min and then leaving the layered product in the apparatus at room temperature until the temperature thereof reaches the room temperature. When such a slow cooling is carried out, the metal carbide layer can be prevented from being cracked due to the stress that is caused by the difference in thermal expansion between the graphite base, the metal carbide layer, and the seed crystal. In this context, the "room temperature" denotes a temperature in the range of 10° C. to 30° C.

In the present invention, when using a container, it is preferable that the seed crystal have a larger area than that of a portion of the graphite base that fixes the seed crystal, and the pressing member have a shape that allows a load to be imposed on the seed crystal, with the pressing member being in contact only with the peripheral portion of the seed crystal. For instance, when the portion of the graphite base that fixes the seed crystal has a diameter of 10 mm and the seed crystal with a diameter of 10.5 mm to 12 mm is used, the area ratio of the seed crystal to the portion is 1.1 to 1.44. Furthermore, when the portion of the graphite base that fixes the seed crystal has a diameter of 16 mm, the diameter of the seed crystal is preferably about 16.5 mm to 18 mm. In this case, the area ratio is 1.06 to 1.27. In other words, it is preferable that the seed crystal have a size that allows the seed crystal to stick out about 0.5 mm to 1 mm from the portion of the graphite base that fixes the seed crystal.

In the above, the shape of the pressing member that allows a load to be imposed on the seed crystal, with the pressing member being in contact only with the peripheral portion of the seed crystal, may be a hollow cylindrical shape, for instance.

Preferably, the peripheral portion of the seed crystal is at least part of the region of the seed crystal that sticks out from the area of the portion of the graphite base that fixes the seed crystal, with the seed crystal being allowed to have a larger area than that of the portion of the graphite base that fixes the seed crystal.

The portion of the seed crystal that sticks out is in contact with the pressing member and thereby the surface of the portion of the seed crystal is roughened. In the atmosphere where a single crystal grows, however, the portion that sticks out and has a roughened surface comes to have a high temperature and therefore is etched to disappear. Accordingly, the portion whose surface has been roughened is eliminated and thereby a good surface, which is not rough, alone remains. This smooth surface that has not been roughened is effective for producing a good-quality single crystal.

EXAMPLES

Examples of the method of fixing a seed crystal to be used for growing a silicon carbide single crystal and the method of manufacturing a single crystal using the fixing method according to the present invention are described below in detail with reference to the drawings.

Example 1

A specific method corresponding to the method of fixing a seed crystal according to the present invention is described with reference to FIGS. 1A to 1C and FIG. 2.

The seed crystal used in the present example was a Reilly seed crystal with a thickness of about 0.3 mm to 0.5 mm that was manufactured by the Reilly method. However, examples of the seed crystal to be used herein include a substrate obtained from an ingot that has grown on the Reilly seed crystal using a sublimation-recrystallization method (the improved Reilly method), a single crystal produced by, for instance, the Acheson method, etc.

As shown in FIG. 1A, a layered product 25 was formed in which a 50-μm thick metallic material 2 made of titanium, a Reilly seed crystal 3, and a pressing member 4 made of graphite for imposing a load were disposed sequentially on a graphite base 1. In this case, the load to be imposed on the seed crystal was set at 33.5 kPa.

Figure 1B:
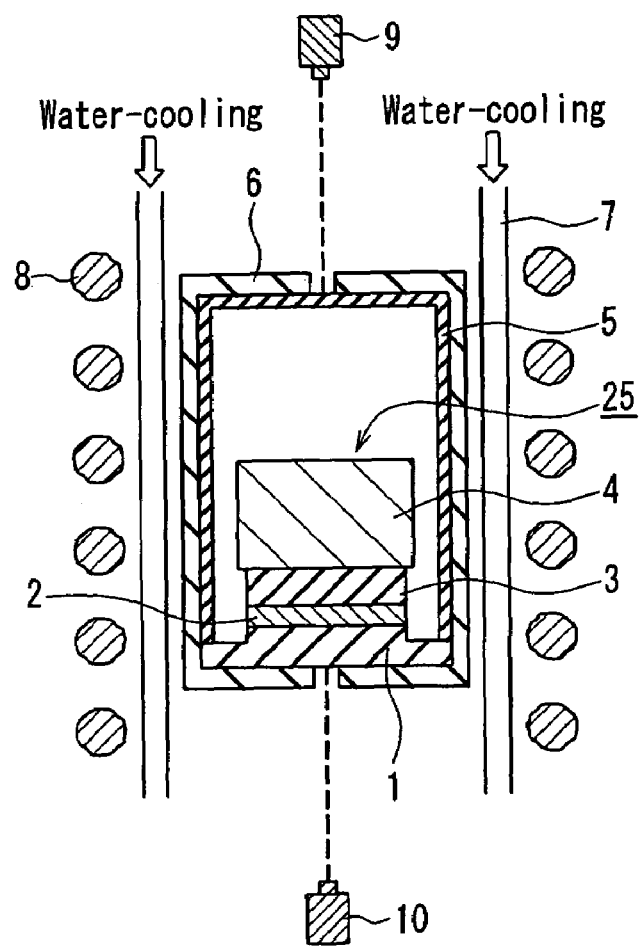

Next, as shown in FIG. 1B, the layered product 25 was covered with a container 5 made of graphite, which further was covered with a heat insulating member 6 having openings in its top and bottom portions. This then was placed in a water-cooled double quartz container 7 whose inner pressure was adjustable. An RF coil 8 and pyrometers 9 and 10 were provided around the double quartz container 7. The RF coil 8 was used for heating the container 5 made of graphite. The pyrometers 9 and 10 were provided on the upper and lower sides of the double quartz container 7 to monitor the temperature of the lower portion of the graphite base 1 and that of the upper portion of the graphite crucible container 5. Practically, a fixture for holding the layered product, a vacuum pump that is used for the evacuation of the double quartz container 7, a pressure-regulating valve for adjusting the atmosphere inside the double quartz container 7, etc. also were provided but are omitted herein.

The double quartz container was evacuated to have a pressure of $5 \times 10^{-4}$ Pa or lower. Thereafter, argon gas was introduced thereinto and the pressure was adjusted to 79.8 kPa (600 Torr). In this state, heating was carried out until the temperature of the lower portion of the graphite base 1, which was indicated as the value measured by the pyrometer 10, reached 1700° C. This was maintained for about three hours. Thereafter, the temperature was lowered to 1100° C. at a rate of 10° C./min. Subsequently, it was cooled naturally over four hours to around the room temperature (25° C.). The layered product 25 was taken out of the double quartz container 7, and the graphite pressing member 4 for imposing a load then was removed.

Figure 1C:
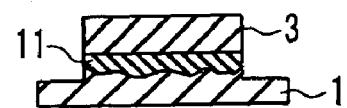

Thus, a product shown in FIG. 1C was obtained in which the Reilly seed crystal 3 had been fixed to the graphite base 1 with the metal carbide layer 11 formed of titanium carbide to form one body therewith. The argon gas was used as the heating atmosphere in the above, but helium, a mixed gas of argon and helium, etc. also may be used as long as it does not react with graphite of the base, silicon carbide of the seed crystal, and the metallic material to be used.

The metal carbide layer 11 made of titanium carbide that is formed by such a fixing method serves as an adhesive layer that allows the Reilly seed crystal 3 including no voids and the graphite base 1 to be bonded to each other and has a melting point of around 3000° C. or higher. Generally, the metal carbide layer 11 prevents a temperature gradient from being caused between the Reilly seed crystal 3 and the graphite base 1 at a temperature of about 2300° C. that allows a silicon carbide single crystal to grow, and thereby can prevent sublimation from occurring from the rear face of the seed crystal 3, which in turn can inhibit the development of macroscopic defects. The melting point of titanium carbide varies according to the carbon content. However, when the carbon content is at least 18 atom %, titanium carbide has a melting point of at least 2500° C. Accordingly, the seed crystal can be maintained in the solid phase even at the growth temperature of the silicon carbide single crystal. Actually, the interface between the graphite base and the seed crystal that had been fixed thereto was subjected to a scanning electron microscope (SEM) observation and an energy dispersive X-ray fluorescence spectrometer (EDX) analysis. As a result, it was found that a titanium carbide layer including no voids had been formed that contained 45 atom % of titanium and 55 atom % of carbon.

In the above, titanium was used as a specific example of the metallic material 2. However, the use of vanadium or zirconium also makes it possible to form the metal carbide layer 11 that includes no voids and allows the seed crystal 3 and the graphite base 1 to be bonded to each other, and thereby can prevent sublimation from occurring from the rear face of the seed crystal. This in turn can inhibit the development of macroscopic defects that extend in a grown single crystal. Vanadium has a melting point of around 1890° C. However, when the carbon content is 35 atom %, vanadium carbide having a melting point of at least 2500° C. is obtained. On the other hand, zirconium has a melting point of 1850° C. However, when the carbon content is 15 atom %, zirconium carbide having a melting point of at least 2500° C. is obtained.

As in the case of using titanium, the SEM observation and the EDX analysis actually were carried out with respect to the interface between a graphite base and a seed crystal that had been fixed to each other using vanadium or zirconium to form one body. As a result, it was confirmed that in the case of using vanadium, a vanadium carbide layer had been formed that contained 51 atom % of vanadium and 49 atom % of carbon, included no voids, and had a melting point of about 2700° C., while in the case of using zirconium, a zirconium carbide layer had been formed that contained 40 atom % of zirconium and 60 atom % of carbon, included no voids, and had a melting point of about 2900° C. In both the cases of using vanadium and zirconium, the heating temperature was set at 1900° C. in consideration of their melting points, and the other conditions were the same as those employed in the case of using titanium.

The metallic material 2 made of titanium had a thickness of 50 μm. However, the use of one having a thickness of 20 μm to 200 μm also allows a sufficiently high adhesive strength to be obtained. In addition, the metal can be prevented from melting and spreading onto the seed crystal surface. This in turn can inhibit micro-pipe defects from developing using as their nuclei metal adhering to the seed crystal surface or can prevent the single crystal to be grown from being contaminated with the metal. Table 1 shows the results obtained when a heat treatment was carried out in argon gas atmosphere having a pressure of 79.8 kPa (600 Torr) at a heating temperature of 1700° C. under a load of 33.5 kPa for three hours while the thickness of titanium was varied.

TABLE 1

| Titanium Thickness (μm) | Adhesive Strength | Spreading |
| --- | --- | --- |
| 5 | X | ◯ |
| 20 | ◯ | ◯ |
| 50 | ◯ | ◯ |
| 100 | ◯ | ◯ |
| 150 | ◯ | ◯ |
| 200 | ◯ | ◯ |
| 250 | ◯ | X |

The evaluation was made by checking the adhesive strength and the spreading of metal onto the crystal surface. That is, the absence and presence of spreading of metal to the crystal surface was indicated with "◯" and "X", respectively.

With respect to the adhesive strength, those that withstood a load exceeding 100 g/cm² were indicated with "◯" while those that withstood only a load of 100 g/cm² or lower were indicated with "X". In this case, since these values concern the size of crystals that can be produced by the sublimation method, larger values are preferred but larger values than are required are not necessary. For instance, when a single crystal ingot having a length of about 100 mm is to be produced using a seed crystal with a diameter of 2 inches, it may be enough to withstand a load of at least 32 g/Cm². It, however, is not enough when larger crystals than that are intended to be produced. The criterion used for judging the adhesive strength was whether the metallic material withstood a load of 100 g/cm² in consideration of practicability.

The evaluation criteria described above also are used in Table 2 and the other tables following it.

As is clear from the results shown in Table 1, the thinner the metallic material is, the lower the adhesive strength is. The metallic material with a thickness of 20 μm had a sufficiently high adhesive strength. However, a thickness reduced to 5 μm resulted in lower adhesive strength and thereby the Reilly seed crystal had not been bonded to the graphite base. On the other hand, the increase in thickness of the metallic material resulted in an increased degree of spreading of the metallic material onto the seed crystal. When the metallic material had a thickness of 200 μm, a sufficiently high adhesive strength was obtained but the trace of molten titanium that had spread a little onto the seed crystal side face remained. However, titanium did not spread onto the Reilly seed crystal surface. Conceivably, this therefore is the limit of thickness that can prevent titanium from spreading. When the thickness was increased to 250 μm, traces of molten titanium were observed on the peripheral portion of the seed crystal surface or the pressing member formed of graphite. Thus, the thickness of titanium is preferably 20 μm to 200 μm.

Similarly, Tables 2 and 3 show the results obtained when a heat treatment was carried out in argon gas atmosphere having a pressure 79.8 kPa (600 Torr) at a heating temperature of 1900° C. under a load of 33.5 kPa for three hours while the thickness of vanadium and zirconium was varied. The same evaluation items as in Table 1 were employed.

TABLE 2

| Vanadium Thickness (μm) | Adhesive Strength | Spreading |
| --- | --- | --- |
| 5 | X | ◯ |
| 20 | ◯ | ◯ |
| 50 | ◯ | ◯ |
| 100 | ◯ | ◯ |
| 150 | ◯ | ◯ |
| 200 | ◯ | ◯ |
| 250 | ◯ | X |

TABLE 3

| Zirconium Thickness (μm) | Adhesive Strength | Spreading |
| --- | --- | --- |
| 5 | X | ◯ |
| 20 | ◯ | ◯ |
| 50 | ◯ | ◯ |
| 100 | ◯ | ◯ |
| 150 | ◯ | ◯ |
| 200 | ◯ | ◯ |
| 250 | ◯ | X |

In the cases of using vanadium and zirconium, the same results as those obtained using titanium were obtained. Specifically, the results indicated that the most suitable thickness was in the range of 20 μm to 200 μm. Thus, as in the case of using titanium, when vanadium or zirconium is used, it is preferable that it have a thickness of 20 μm to 200 μm.

Judging from the above, a suitable thickness of the metallic material 2 is in the range of 20 µm to 200 µm when using the above-mentioned three types of materials.

Now, the specific conditions of heating temperature are described below. In the present example, the heating temperature employed in the heating process was set at 1700° C., 1900° C., and 1900° C. in the case of using titanium, vanadium, and zirconium as the metallic material, respectively. Respective suitable heating temperature ranges are indicated below. The suitable heating temperature ranges allow the seed crystal 3 and the graphite base 1 to be bonded strongly to each other using the metal carbide layer 11 and also can inhibit the development of macroscopic defects.

Table 4 to 6 show the results obtained when a heat treatment was carried out in argon gas atmosphere having a pressure 79.8 kPa (600 Torr) under a load of 33.5 kPa for three hours using 50-µm thick titanium, vanadium, and zirconium as the metallic material while the heating temperature was varied.

The evaluation was made by checking the adhesive strength and the macroscopic defect density that were employed as evaluation items. The macroscopic defects were evaluated as follows. That is, a single crystal whose size was about 8 mm was grown, under the same growth conditions, on the seed crystal that had been fixed under predetermined conditions, the single crystal thus grown was sliced in parallel to the growth direction, this then was polished, and thereafter the cross section thereof was observed. Using the transmission mode of an optical microscope, the number of macroscopic defects was counted while the focal point was shifted in the direction of the thickness of the sample whose cross section was observed. The number then was divided by the width of the seed crystal and the thickness of the sample. Thus the macroscopic defect density was calculated. A macroscopic defect density of 0 to 100/cm$^2$ is indicated with "○", that of 100 to 500/cm$^2$ is indicated with "Δ", and that of 500/cm$^2$ or higher is indicated with "×". These evaluation criteria also are used in Table 4 and the other tables following it.

Figure 2:
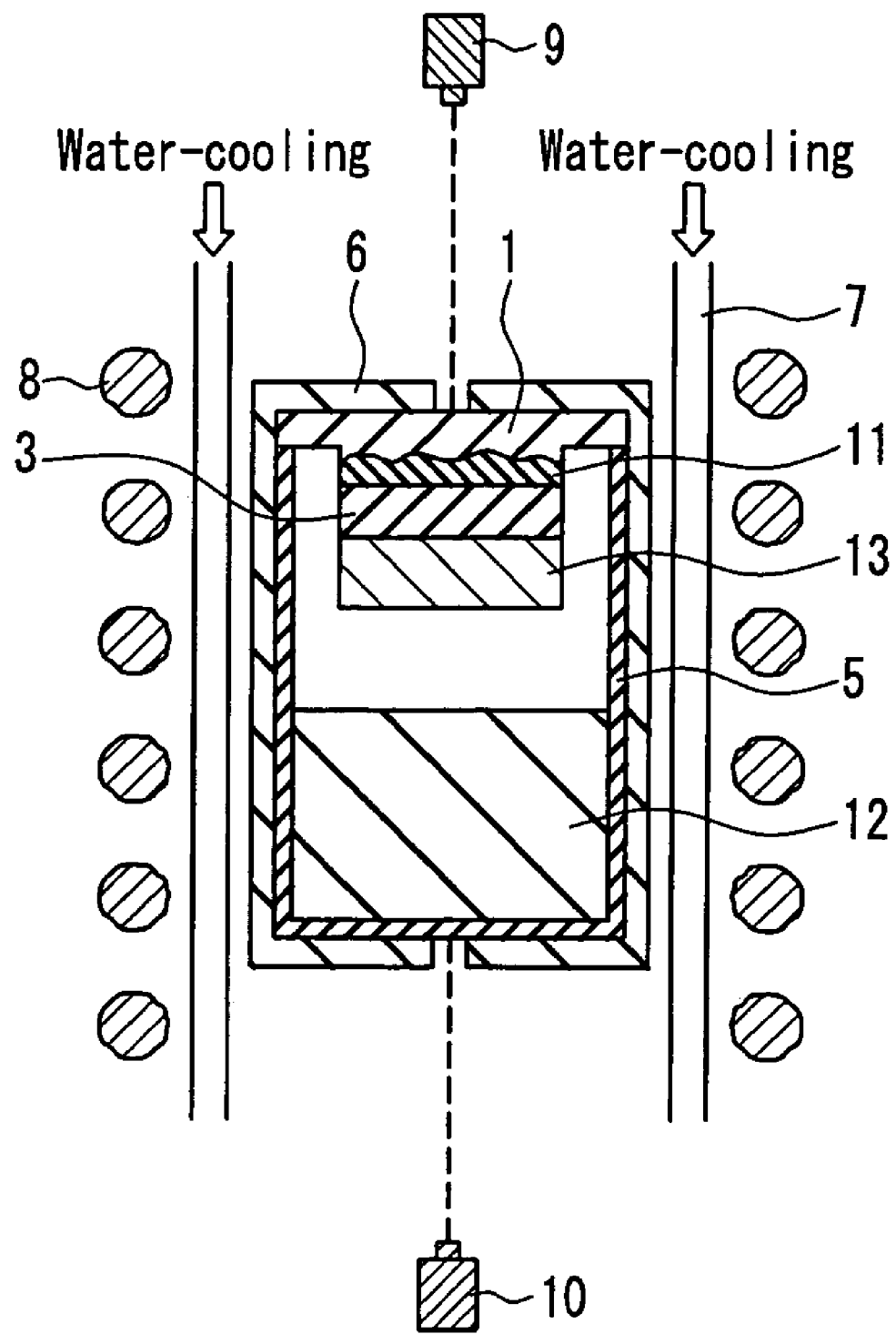
FIG. 2 is a cross sectional view showing a method of manufacturing a silicon carbide single crystal according to Example 1 of the present invention.

The following procedure of growing a single crystal was employed for evaluating macroscopic defects. As shown in FIG. 2, a graphite crucible includes a container 5 made of graphite and a graphite base 1 to which a seed crystal 3 has been fixed with a metal carbide layer 11. In the lower half of the graphite crucible, SiC powder 12 is contained as a raw material powder. This then is covered with a heat insulating member 6 having openings in its top and bottom portions. Thereafter, this is placed in a water-cooled double quartz container 7 whose inner pressure is adjustable. An RF coil 8 and pyrometers 9 and 10 are provided around the double quartz container 7. The RF coil 8 is used for heating the graphite crucible while the pyrometers 9 and 10 are provided on the upper and lower sides of the double quartz container 7 to monitor the temperatures of the graphite base 1 and the container 5 made of graphite. Practically, a fixture for holding the crucible, a vacuum pump that is used for the evacuation of the double quartz container 7, a pressure-regulating valve for adjusting the atmosphere inside the double quartz container 7, etc. also are provided but are omitted herein. Subsequently, the temperature is raised on the SiC powder 12 side and is lowered on the seed crystal 3 side and thereby sublimation gas is allowed to recrystallize on the seed crystal to grow a silicon carbide single crystal 13. The conditions employed for growing the silicon carbide single crystal to be used for the observation of macroscopic defects were as follows. The growth was carried out in argon gas atmosphere having a pressure of 3.99 kPa (30 Torr), the temperature of the SiC powder side was 2350° C., the temperature of the seed crystal side was 2200° C., and the growth time was 30 hours. The growth amount was about 8 mm.

Table 4 shows the relationships between heating temperatures and the adhesive strength as well as the macroscopic defects, which were obtained when titanium was used as the metallic material.

TABLE 4

| Heating Temperature (° C.) | Adhesive Strength | Macroscopic Defects |
| --- | --- | --- |
| 1400 | X | — |
| 1500 | ○ | X |
| 1600 | ○ | Δ |
| 1700 | ○ | ○ |
| 1800 | ○ | ○ |
| 1900 | ○ | ○ |
| 2000 | ○ | ○ |
| 2050 | X | — |

As is clear from Table 4, when the heating temperature is in the range of 1500° C. to 1600° C., the adhesive strength is sufficiently high but the macroscopic defect density tends to increase with the decrease in heating temperature. Conceivably, this is because the heating temperature is lower than the melting point of titanium, specifically about 1675° C., titanium therefore does not melt completely, which prevents the reaction between the titanium and graphite of the base from progressing, and thereby a titanium carbide layer is formed that contains less than 18 atom % of carbon and therefore has a lower melting point than 2500° C. On the other hand, when the heating temperature was in the range of 1700° C. to 2000° C., good results were obtained with respect to both the adhesive strength and the macroscopic defect density. Conceivably, this is because titanium melts completely, the reaction between the titanium and the graphite of the base therefore progresses well, and thereby a titanium carbide layer is formed that contains more than 18 atom % of carbon and therefore has a higher melting point than 2500° C. When the heating temperature further is raised to 2050° C., the seed crystal is not bonded to the base. Presumably, this is because the heating temperature is high, molten titanium and the graphite of the base thereby over-react with each other, and as a result, a carbon-rich titanium carbide layer then is formed to produce a porous layer structure. Hence, when using titanium as the metallic material, it is preferable that the heating temperature be in the range of 1700° C. to 2000° C.

Table 5 shows the relationships between heating temperatures and the adhesive strength as well as the macroscopic defects, which were obtained when vanadium was used as the metallic material.

TABLE 5

| Heating Temperature (° C.) | Adhesive Strength | Macroscopic Defects |
| --- | --- | --- |
| 1700 | X | — |
| 1800 | ○ | Δ |
| 1900 | ○ | ○ |
| 2000 | ○ | ○ |
| 2100 | ○ | ○ |
| 2200 | ○ | ○ |
| 2300 | X | — |

As is clear from Table 5, the seed crystal was not bonded to the graphite base at a heating temperature of 1700° C. When the heating temperature was 1800° C., the adhesive strength was sufficiently high but macroscopic defects were observed. Conceivably, this is because the heating temperature is lower than the melting point of vanadium, specifically about 1890° C., vanadium therefore does not melt completely, which prevents the reaction between the vanadium and graphite of the base from progressing, and thereby a vanadium carbide layer is formed that contains less than 35 atom % of carbon and therefore has a lower melting point than 2500° C. On the other hand, when the heating temperature was in the range of 1900° C. to 2200° C., good results were obtained with respect to both the adhesive strength and the macroscopic defect density. Conceivably, this is because the vanadium melts completely, the reaction between the vanadium and the graphite of the base therefore progresses well, and thereby a vanadium carbide layer is formed that contains more than 35 atom % of carbon and therefore has a higher melting point than 2500° C. When the heating temperature was 2300° C., the seed crystal was not bonded to the base. Presumably, this is because as in the case of using titanium as the metallic material, the heating temperature is high, molten vanadium and the graphite of the base thereby overreact with each other, and as a result, a carbon-rich vanadium carbide layer is formed and has a porous layer structure. Hence, when using vanadium as the metallic material, it is preferable that the heating temperature be in the range of 1900° C. to 2200° C.

Table 6 shows the relationships between heating temperatures and the adhesive strength as well as the macroscopic defects, which were obtained when zirconium was used as the metallic material.

TABLE 6

| Heating Temperature (° C.) | Adhesive Strength | Macroscopic Defects |
| --- | --- | --- |
| 1700 | X | — |
| 1800 | ◯ | Δ |
| 1900 | ◯ | ◯ |
| 2000 | ◯ | ◯ |
| 2100 | ◯ | ◯ |
| 2200 | ◯ | ◯ |
| 2300 | X | — |

As is clear from Table 6, the seed crystal was not bonded to the base at a heating temperature of 1700° C. When the heating temperature was 1800° C., the adhesive strength was sufficiently high but macroscopic defects were observed. Conceivably, this is because the heating temperature is lower than the melting point of zirconium, specifically about 1850° C., zirconium therefore does not melt completely, which prevents the reaction between the zirconium and graphite of the base from progressing, and thereby a zirconium carbide layer is formed that contains less than 15 atom % of carbon and therefore has a lower melting point than 2500° C. On the other hand, when the heating temperature was in the range of 1900° C. to 2200° C., good results were obtained with respect to both the adhesive strength and the macroscopic defect density. Conceivably, this is because the zirconium melts completely, the reaction between the zirconium and the graphite of the base therefore progresses well, and thereby a zirconium carbide layer is formed that contains more than 15 atom % of carbon and therefore has a higher melting point than 2500° C. When the heating temperature was 2300° C., the seed crystal was not bonded to the base. Presumably, this is because as in the case of using titanium or vanadium as the metallic material, the heating temperature is high, molten zirconium and the graphite of the base thereby overreact with each other, and as a result, a carbon-rich zirconium carbide layer is formed and has a porous layer structure. Hence, when using zirconium as the metallic material, it is preferable that the heating temperature be in the range of 1900° C. to 2200° C.

Now, specific conditions of the heating time are described below. In the present example, a specific example of the heating time employed in the heating process was described as three hours when using titanium, vanadium, and zirconium as the metallic material 2. In the case of using any of them, however, the Reilly seed crystal 3 and the graphite base 1 can be bonded strongly to each other with the metal carbide layer 11 and the development of macroscopic defects can be inhibited as long as the heating time is in the range of 1 to 6 hours. Tables 7 to 9 show the results of adhesive tests obtained when a heat treatment was carried out in argon gas atmosphere having a pressure of 79.8 kPa (600 Torr) under a load of 33.5 kPa using 50-μm thick titanium, vanadium, and zirconium as the metallic material, respectively, while the heating time was varied. With consideration given to the results described above, the heating temperature was set in the range of 1700° C. to 2000° C. when titanium was used as the metallic material and in the range of 1900° C. to 2200° C. when vanadium and zirconium each were used as the metallic material. The adhesive strength and the macroscopic defect density were employed as evaluation items.

Table 7 shows the relationships between heating times and the adhesive strength as well as the macroscopic defects, which were obtained when titanium was used as the metallic material.

TABLE 7

| Heating | 1700° C. | | 1800° C. | | 1900° C. | | 2000° C. | |
| --- | --- | --- | --- | --- | --- | --- | --- | --- |
| Time (Hour) | A.S.*[1] | M.D.*[2] | A.S.*[1] | M.D.*[2] | A.S.*[1] | M.D.*[2] | A.S.*[1] | M.D.*[2] |
| 0.5 | X | — | X | — | X | — | ◯ | X |
| 1 | ◯ | ◯ | ◯ | ◯ | ◯ | ◯ | ◯ | ◯ |
| 3 | ◯ | ◯ | ◯ | ◯ | ◯ | ◯ | ◯ | ◯ |
| 6 | ◯ | ◯ | ◯ | ◯ | ◯ | ◯ | ◯ | ◯ |
| 8 | ◯ | Δ | ◯ | Δ | ◯ | Δ | ◯ | X |
| 12 | ◯ | X | ◯ | X | ◯ | X | X | — |

*[1]"A.S." denotes "Adhesive Strength".
*[2]"M.D." denotes "Macroscopic Defects".

As is clear from Table 7, the seed crystal was not bonded to the graphite base at heating temperatures of 1700° C., 1800° C., and 1900° C. when the heating time was 0.5 hour. This conceivably is because the heating time of 0.5 hour is not long enough for titanium to melt at heating temperatures in the range of 1700° C. to 1900° C. When the heating temperature was 2000° C., the adhesive strength was sufficiently high but macroscopic defects were observed. Conceivably, this is because titanium melts to react with the graphite base at a heating temperature of 2000° C. and a heating time of 0.5 hour but the heating time is short and the reaction time therefore is short, which results in the formation of a titanium carbide layer that contains less than 18 atom % of carbon and therefore has a lower melting point than 2500° C. When the heating time was 1 to 6 hours, good results were obtained at heating temperatures in the range of 1700° C. to 2000° C. with respect to both the adhesive strength and the macroscopic defect density. This conceivably is because in this condition range, the titanium melts completely to react well with the graphite of the base, and thereby a titanium carbide layer is formed that contains more than 18 atom % of carbon and therefore has a higher melting point than 2500° C. When the heating time was 8 hours or longer, the adhesive strength tended to deteriorate and the macroscopic defect density tended to increase at all the heating temperatures. Presumably, this is because the heating time is long, molten titanium and the graphite of the base thereby overreact with each other, and as a result, a carbon-rich titanium carbide layer is formed and has a porous layer structure. Hence, when using titanium, it is preferable that the heating time be in the range of 1 to 6 hours.

Table 8 shows the relationships between heating times and the adhesive strength as well as the macroscopic defects, which were obtained when vanadium was used as the metallic material.

enough for vanadium to melt at heating temperatures in the range of 1900° C. to 2000° C. When the heating temperature was 2200° C., the adhesive strength was sufficiently high but macroscopic defects were observed. Conceivably, this is because vanadium melts to react with the graphite base at a heating temperature of 2200° C. and a heating time of 0.5 hour but the heating time is short and the reaction time therefore is short, which results in the formation of a vanadium carbide layer that contains less than 35 atom % of carbon and therefore has a lower melting point than 2500° C. When the heating time was 1 to 6 hours, good results were obtained at heating temperatures in the range of 1900° C. to 2200° C. with respect to both the adhesive strength and the macroscopic defect density. This conceivably is because in this condition range, the vanadium melts completely to react well with the graphite of the base, and thereby a vanadium carbide layer is formed that contains more than 35 atom % of carbon and therefore has a higher melting point than 2500° C. When the heating time was 8 hours or longer, the adhesive strength tended to deteriorate and the macroscopic defect density tended to increase at all the heating temperatures. Presumably, this is because the heating time is long, molten vanadium and the graphite of the base thereby overreact with each other, and as a result, a carbon-rich vanadium carbide layer is formed and has a porous layer structure. Hence, when using vanadium, it is preferable that the heating time be in the range of 1 to 6 hours.

TABLE 8

| Heating | 1900° C. | | 2000° C. | | 2200° C. | |
|---|---|---|---|---|---|---|
| Time (Hour) | Adhesive Strength | Macroscopic Defects | Adhesive Strength | Macroscopic Defects | Adhesive Strength | Macroscopic Defects |
| 0.5 | X | — | X | — | ○ | X |
| 1 | ○ | ○ | ○ | ○ | ○ | ○ |
| 3 | ○ | ○ | ○ | ○ | ○ | ○ |
| 6 | ○ | ○ | ○ | ○ | ○ | ○ |
| 8 | ○ | Δ | ○ | Δ | ○ | X |
| 12 | ○ | X | ○ | X | X | — |

As is clear from Table 8, the seed crystal was not bonded to the graphite base at heating temperatures of 1900° C. and 2000° C. when the heating time was 0.5 hour. This conceivably is because the heating time of 0.5 hour is not long Table 9 shows the relationships between heating times and the adhesive strength as well as the macroscopic defects, which were obtained when zirconium was used as the metallic material.

TABLE 9

| Heating | 1900° C. | | 2000° C. | | 2200° C. | |
|---|---|---|---|---|---|---|
| Time (Hour) | Adhesive Strength | Macroscopic Defects | Adhesive Strength | Macroscopic Defects | Adhesive Strength | Macroscopic Defects |
| 0.5 | X | — | X | — | ○ | X |
| 1 | ○ | ○ | ○ | ○ | ○ | ○ |
| 3 | ○ | ○ | ○ | ○ | ○ | ○ |
| 6 | ○ | ○ | ○ | ○ | ○ | ○ |
| 8 | ○ | Δ | ○ | Δ | ○ | X |
| 12 | ○ | X | ○ | X | X | — |

As is clear from Table 9, the seed crystal was not bonded to the graphite base at heating temperatures of 1900° C. and 2000° C. when the heating time was 0.5 hour. This conceivably is because the heating time of 0.5 hour is not long enough for zirconium to melt at heating temperatures in the range of 1900° C. to 2000° C. When the heating temperature was 2200° C., the adhesive strength was sufficiently high but macroscopic defects were observed. Conceivably, this is range of 1900° C. to 2200° C. when vanadium or zirconium was used as the metallic material. The adhesive strength and the macroscopic defect density were employed as evaluation items.

Table 10 shows the relationships between loads and the adhesive strength as well as the macroscopic defects, which were obtained when titanium was used as the metallic material.

TABLE 10

| | 1700° C. | | 1800° C. | | 1900° C. | | 2000° C. | |
|---|---|---|---|---|---|---|---|---|
| Load (kPa) | A.S.*[1] | M.D.*[2] | A.S.*[1] | M.D.*[2] | A.S.*[1] | M.D.*[2] | A.S.*[1] | M.D.*[2] |
| 0 | X | — | X | — | X | — | X | X |
| 4.23 | ○ | Δ | ○ | Δ | ○ | Δ | ○ | Δ |
| 7.84 | ○ | ○ | ○ | ○ | ○ | ○ | ○ | ○ |
| 16.4 | | | ○ | ○ | | | | |
| 33.5 | ○ | ○ | ○ | ○ | ○ | ○ | ○ | ○ |
| 33.8 | ○ | ○ | ○ | ○ | ○ | ○ | ○ | ○ |
| 67.6 | ○ | ○ | ○ | ○ | ○ | ○ | ○ | ○ |
| 87.5 | ○ | ○ | ○ | ○ | ○ | ○ | ○ | ○ |
| 95.3 | X(*)*[3] | — | X(*)*[3] | — | X(*)*[3] | — | X(*)*[3] | — |

*[1]"A.S." denotes "Adhesive Strength".
*[2]"M.D." denotes "Macroscopic Defects".
*[3]"X(*)" denotes the state where the seed crystal and the base were bonded to each other but the single crystal growth to take place later may be affected.

because zirconium melts to react with the graphite base at a heating temperature of 2200° C. and a heating time of 0.5 hour but the heating time is short and the reaction time therefore is short, which results in the formation of a zirconium carbide layer that contains less than 15 atom % of carbon and therefore has a lower melting point than 2500° C. When the heating time was 1 to 6 hours, good results were obtained at heating temperatures in the range of 1900° C. to 2200° C. with respect to both the adhesive strength and the macroscopic defect density. This conceivably is because in this condition range, the zirconium melts completely to react well with the graphite of the base, and thereby a zirconium carbide layer is formed that contains more than 15 atom % of carbon and therefore has a higher melting point than 2500° C. When the heating time was 8 hours or longer, the adhesive strength tended to deteriorate and the macroscopic defect density tended to increase at all the heating temperatures. Presumably, this is because the heating time is long, molten zirconium and the graphite of the base thereby overreact with each other, and as a result, a carbon-rich zirconium carbide layer is formed and has a porous layer structure. Hence, when using zirconium, it is preferable that the heating time be in the range of 1 to 6 hours.

Now, the pressing conditions that are employed at the time of bonding are described below. In the present example, the load to be imposed by the pressing member 4, which was a graphite member, for imposing a load at the time of bonding was set at 33.5 kPa. When using any metallic material of titanium, vanadium, and zirconium, however, the seed crystal 3 and the graphite base 1 can be bonded strongly to each other with the metal carbide layer 11 and the development of macroscopic defects can be inhibited as long as the load is in the range of 7.84 kPa to 87.5 kPa. Tables 10 to 12 show the results obtained when a heat treatment was carried out in argon gas atmosphere having a pressure of 79.8 kPa (600 Torr) for three hours using 50-μm thick titanium, vanadium, and zirconium as the metallic material 2, respectively, while the load was varied. The heating temperature was set in the range of 1700° C. to 2000° C. when titanium was used as the metallic material and in the As is clear from Table 10, the adhesive strength was sufficiently high but macroscopic defects, the number of which was small though, were observed under a load of 4.23 kPa at all the temperatures. Conceivably, this is because the load is low, the seed crystal and the titanium or the titanium and the graphite base therefore are locally in contact or out of contact with each other at the interface therebetween, and accordingly, the heat treatment results in the presence of portions where the titanium and the graphite have reacted well with each other and portions where the reaction therebetween is insufficient. Thus, presumably, the adhesive layer to be obtained is a layer including both a titanium carbide layer that contains more than 18 atom % of carbon and a titanium carbide layer that contains less than 18 atom % of carbon, and this allows the adhesive strength to be sufficiently high but cannot inhibit the development of macroscopic defects. Good results were obtained under a load of 7.84 kPa to 87.5 kPa in the whole temperatures range with respect to both the adhesive strength and the macroscopic defect density. This conceivably is because the seed crystal and the titanium or the titanium and the graphite base are thoroughly in good contact with each other at the interface therebetween, and this allows the titanium and the graphite to react with each other uniformly throughout their whole contact surfaces when they are heat-treated. When the load was 95.3 kPa, the adhesive strength was sufficiently high, but the periphery of the seed crystal was chipped off or cracks were caused from the periphery after bonding due to the high load. In the table, the mark "x(*)" denotes the state where the seed crystal and the base were bonded to each other but the single crystal growth to take place later may be affected. Accordingly, the load to be imposed when the heating temperature is in the range of 1700° C. to 2000° C. and titanium is used is preferably 7.84 kPa to 87.5 kPa.

FIG. 11 shows the relationships between loads and the adhesive strength as well as the macroscopic defects, which were obtained when vanadium was used as the metallic material.

TABLE 11

| Load (kPa) | 1900° C. | | 2000° C. | | 2200° C. | |
|---|---|---|---|---|---|---|
| | Adhesive Strength | Macroscopic Defects | Adhesive Strength | Macroscopic Defects | Adhesive Strength | Macroscopic Defects |
| 0 | X | — | X | — | X | — |
| 4.23 | ○ | Δ | ○ | Δ | ○ | Δ |
| 7.84 | ○ | ○ | ○ | ○ | ○ | ○ |
| 33.5 | ○ | ○ | ○ | ○ | ○ | ○ |
| 67.6 | ○ | ○ | ○ | ○ | ○ | ○ |
| 87.5 | ○ | ○ | ○ | ○ | ○ | ○ |
| 95.3 | X(*)[1] | — | X(*)[1] | — | X(*)[1] | — |

[1]"X(*)" denotes the state where the seed crystal and the base were bonded to each other but the single crystal growth to take place later may be affected.

As is clear from Table 11, good results were obtained under a load of 7.84 kPa to 87.5 kPa with respect to both the adhesive strength and the macroscopic defect density. The reason is the same as in the test carried out using titanium. Accordingly, the load to be imposed when the heating temperature is in the range of 1900° C. to 2200° C. and vanadium is used is preferably 7.84 kPa to 87.5 kPa.

FIG. 12 shows the relationships between loads and the adhesive strength as well as the macroscopic defects, which were obtained when zirconium was used as the metallic material.

TABLE 12

| Load (kPa) | 1900° C. | | 2000° C. | | 2200° C. | |
|---|---|---|---|---|---|---|
| | Adhesive Strength | Macroscopic Defects | Adhesive Strength | Macroscopic Defects | Adhesive Strength | Macroscopic Defects |
| 0 | X | — | X | — | X | — |
| 4.23 | ○ | Δ | ○ | Δ | ○ | Δ |
| 7.84 | ○ | ○ | ○ | ○ | ○ | ○ |
| 33.5 | ○ | ○ | ○ | ○ | ○ | ○ |
| 67.6 | ○ | ○ | ○ | ○ | ○ | ○ |
| 87.5 | ○ | ○ | ○ | ○ | ○ | ○ |
| 95.3 | X(*)[1] | — | X(*)[1] | — | X(*)[1] | — |

[1]"X(*)" denotes the state where the seed crystal and the base were bonded to each other but the single crystal growth to take place later may be affected.

As is clear from Table 12, good results were obtained under a load of 7.84 kPa to 87.5 kPa with respect to both the adhesive strength and the macroscopic defect density. The reason is the same as in the test carried out using titanium. Accordingly, the load to be imposed when the heating temperature is in the range of 1900° C. to 2200° C. and zirconium is used is preferably 7.84 kPa to 87.5 kPa.

In the present example, graphite was used as a specific example of the pressing member 4 used for imposing a load. However, even when using a pressing member made of at least one of tantalum, niobium, molybdenum, tantalum carbide, niobium carbide, and molybdenum carbide, the pressing member 4 does not melt and therefore the reaction between the seed crystal 3 and the pressing member 4 does not occur during the heating process. Accordingly, when using such a pressing member, the seed crystal surface is not contaminated and therefore the introduction of impurities into the single crystal to be grown can be inhibited.

As described above, a metallic material is melted to react with graphite under optimal heat treatment conditions, and thereby a seed crystal and a graphite base are bonded strongly to each other with the metal carbide layer including no voids and having a melting point that is not lower than the single crystal growth temperature. Thus the development of macroscopic defects to extend in the single crystal grown on the seed crystal can be inhibited considerably.

Example 2

A specific method corresponding to another method of fixing a seed crystal according to the present invention is described with reference to FIGS. 3A to 3C.

Figure 3A:
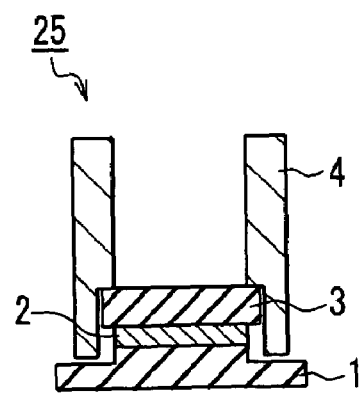
FIGS. 3A to 3C are cross sectional views showing a method of fixing a seed crystal to be used for growing a single crystal according to Example 2 of the present invention.

As shown in FIG. 3A, a layered product 25 was formed in which a 50-μm thick metallic material 2 formed of titanium, a Reilly seed crystal 3, and a pressing member 4 formed of graphite are disposed sequentially on a graphite base 1. The Reilly seed crystal 3 had a larger area than that of the region of the graphite base 1 that supported the seed crystal. The pressing member 4 is used for imposing a load and is placed so as to be in contact only with at least part of the region of the seed crystal that sticks out from the region of the graphite base 1 that supported the seed crystal. The load to be imposed on the seed crystal was set at 33.5 kPa. Since FIG. 3A is a cross sectional view, the shape of the pressing member is difficult to recognize. However, when viewed from the upper side thereof, the pressing member has a doughnut shape with an opening in its center. The opening makes it possible to check the seed crystal surface other than the region that is in contact with the pressing member.

Figure 3B:
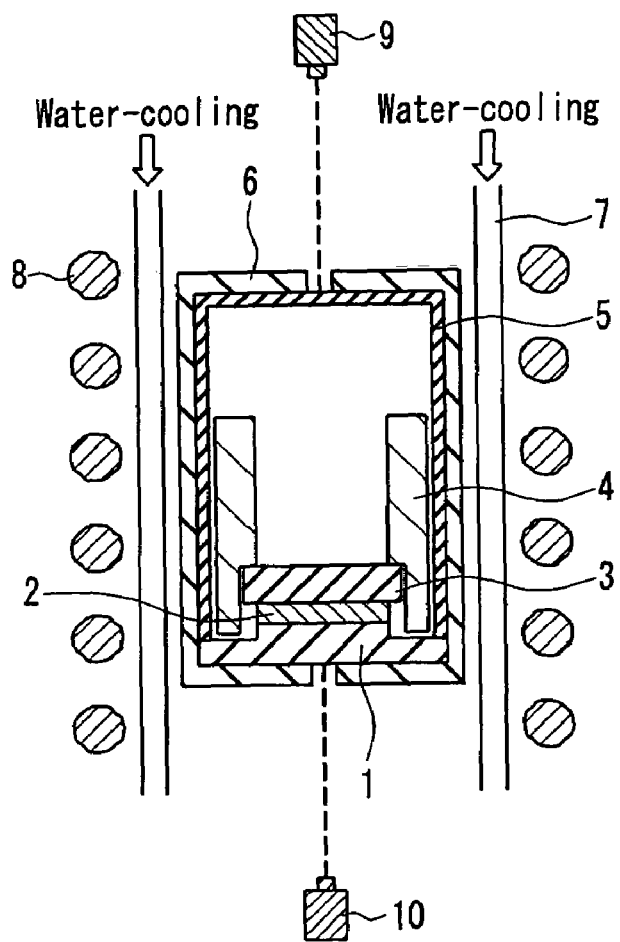
Figure 3C:
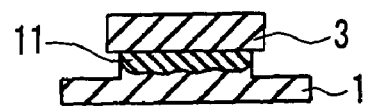

As shown in FIG. 3B, the layered product 25 was covered with a container 5 made of graphite, which further was covered with a heat insulating member 6 having openings in its top and bottom portions. This then was placed in a water-cooled double quartz container 7 whose inner pressure was adjustable. An RF coil 8 and pyrometers 9 and 10 were provided around the double quartz container 7. The RF coil 8 was used for heating the layered product 25 covered with the container 5 made of graphite. The pyrometers 9 and 10 were provided on the upper and lower sides of the double quartz container 7 to monitor the temperature of the lower portion of the graphite base 1 and that of the upper portion of the container 5 made of graphite. Practically, a fixture for holding the crucible, a vacuum pump that is used for the evacuation of the double quartz container 7, a pressure-regulating valve for adjusting the atmosphere inside the double quartz container 7, etc. also are provided but are omitted herein. Subsequently, the double quartz container was evacuated to have a pressure of $5 \times 10^{-4}$ Pa or lower. Thereafter, argon gas was introduced thereinto and the pressure was adjusted to 93.1 kPa (700 Torr). Heating then was carried out until the temperature of the lower portion of the graphite base 1, which was indicated as the value measured by the pyrometer 10, reached 1700° C. and the temperature of the upper portion of the graphite container 5, which was indicated as the value measured by the pyrometer 9, reached at least 1700° C. This was maintained for about three hours in the state of (the lower portion temperature−the upper portion temperature)≦0. Thereafter, the temperature was lowered to 1100° C. at a rate of 10° C./min. Subsequently, it was cooled naturally to around room temperature (25° C.) over four hours. After that, the layered product 25 covered with the graphite container 5 was taken out of the double quartz container 7, and the graphite container 5 and the graphite pressing member 4 for imposing a load then were removed. Thus, as shown in FIG. 3C, a layered product was obtained in which the Reilly seed crystal 3 was fixed to the graphite base 1 with the metal carbide layer 11 formed of titanium carbide, which formed one body. The difference in temperature between the lower portion of the graphite base 1 and the upper portion of the graphite container 5 was adjusted as follows. While the temperature of the lower portion of the graphite base 1 was controlled so as to be a predetermined constant temperature, the relative positional relationship between the RF coil 8 and the layered product 25 covered with the graphite container 5 was varied. Thereby the temperature of the upper portion was varied.

The metal carbide layer 11 made of titanium carbide formed by such a fixing method is an adhesive layer having a melting point of about 3000° C. or higher that allows the Reilly seed crystal 3 including no voids and the graphite base 1 to be bonded to each other. Usually, no temperature gradient is caused between the Reilly seed crystal 3 and the graphite base 1 at a temperature of around 2300° C. that is employed for growing a silicon carbide single crystal. Accordingly, the sublimation from the rear face of the seed crystal 3 was prevented, and the development of macroscopic defects was inhibited. Furthermore, after the seed crystal 3 has been fixed to the graphite base 1, the surface of the seed crystal 3 is not roughened. Hence, when a single crystal was grown on the seed crystal 3, micro-pipe defects were inhibited from developing from the interface between the seed crystal surface and the growth layer. Thus a high-quality silicon carbide single crystal was obtained.

Example 2 of the present invention is different from Example 1 in the following two points. First, the area of the seed crystal 3 was larger than that of the region of the graphite base 1 that supported the seed crystal, and at least part of the region of the seed crystal that stuck out from the region of the graphite base 1 that supported the seed crystal was allowed to be in contact with the pressing member 4. Second, the difference in temperature between the lower portion of the graphite base 1 and the upper portion of the graphite container 5 was adjusted. Except for these two points, the type of the metallic material, the thickness thereof, the heating temperature range, the heating time range, the load range, etc. are the same as those described in Example 1 and therefore the descriptions thereof are not repeated herein. In the present example, the description is made with respect to the case of using titanium as the metallic material. However, the same applies to the cases of using vanadium and zirconium.

The present example is characterized mainly in that the area of the seed crystal 3 is larger than that of the region of the graphite base 1 that supports the seed crystal, and the pressing member 4 is in contact only with at least part of the region of the seed crystal that sticks out from the region of the graphite base 1 that supports the seed crystal. The effects that are obtained thereby are described below.

The seed crystal was fixed under the following conditions. That is, 50-μm thick titanium was used as the metallic material, the lower portion had a temperature of 1700° C., the upper portion had a temperature of 1665° C., the heating time was three hours, and the load was set at 33.5 kPa. The region of the graphite base that supported the seed crystal had a diameter of 10 mm, and the Reilly seed crystal used here had a substantially circular shape and a diameter of 11 mm. The graphite pressing member was allowed to be in contact with the peripheral portion of the seed crystal having a width of about 0.5 mm. For the evaluation items, the initial surface roughness Ra of the seed crystal and the surface roughness Ra thereof after fixation were measured, and the macroscopic defect density and the micro-pipe density were determined through observation of the cross section of a single crystal that had been grown using the seed crystal. The conditions under which the single crystal was grown were the same as in Example 1. The measurement of the surface roughness Ra was carried out using New View 5032 manufactured by Zygo Corporation. The region subjected to the measurement had a size of 0.14 mm (length)×0.11 mm (breadth). As a comparison, the same test also was carried out with the graphite pressing member being in contact with the whole surface of the Reilly seed crystal. The results are shown in Table 13.

TABLE 13

| Pressing Member | Contact with Only Peripheral Portion | Contact with Whole Surface |
| --- | --- | --- |
| Initial Ra (nm) | 0.504 | 0.536 |
| After Fixation Ra (nm) | 1.596 | 8.365 |
| Macroscopic Defect Density (/cm$^2$) | 0 | 0 |
| Micro-Pipe Density (/cm$^2$) | 3300 | 10000 |

As is clear from Table 13, the seed crystal had a surface roughness Ra of 1.596 nm after being fixed when the pressing member was in contact only with the peripheral portion of the seed crystal, while the seed crystal had a surface roughness Ra of 8.365 nm after being fixed when the pressing member was in contact with the whole surface of the seed crystal. Obviously, in the case of using the method in which the pressing member is allowed to be in contact only with the peripheral portion, the seed crystal that has been fixed has a lower surface roughness. Conceivably, this is because the heat treatment was carried out at 1700° C. This causes a state where silicon that is a constituent element of silicon carbide and has a melting point as low as about 1450° C. can come out of the seed crystal surface easily, and thereby the reaction between the graphite and silicon is promoted when the graphite pressing member is in contact with the whole surface of the seed crystal. Even when the pressing member is in contact only with the peripheral portion, the peripheral region with which the pressing member is in contact has a deteriorated surface roughness Ra, specifically 7.963 nm, as in the case where the pressing member is in contact with the whole surface. However, in the atmosphere in which the single crystal is grown, the region of the seed crystal that sticks out from the region of the graphite base that supports the seed crystal becomes very hot and is etched thermally to disappear. Hence, the quality of the single crystal is not affected. The macroscopic defect density was zero in both the cases. Conceivably, the titanium carbide layer provides excellent adhesiveness. The micro-pipe density was $3300/cm^2$ when the pressing member was in contact only with the peripheral portion, while it was $10000/cm^2$ when the pressing member was in contact with the whole surface. Presumably, the micro-pipe density depends on the surface roughness obtained after fixation of the seed crystal since the conditions employed for fixing the seed crystal and those employed for growing the single crystal were the same in both the cases.

With consideration given to the above, it is optimal to form the pressing member for imposing a load at the time of bonding into a shape that allows the pressing member to be in contact only with at least part of the region of the seed crystal that sticks out from the region of the graphite base that supports the seed crystal.

The following description is directed to the effect, together with the results, obtained by employing the configuration in which the area of the seed crystal 3 is larger than that of the region of the graphite base 1 that supports the seed crystal, the pressing member 4 is allowed to be in contact only with the region of the seed crystal that sticks out from the region of the graphite base 1 that supports the seed crystal, and the difference in temperature between the lower portion of the graphite base 1 and the upper portion of the graphite container 5 is adjusted. The seed crystal was fixed under the following conditions. The metallic material was 50-μm thick titanium, the lower portion had a temperature of 1700° C., the heating time was three hours, the load was set at 33.5 kPa, and the temperature of the upper portion was varied as a parameter. The region of the graphite base that supported the seed crystal had a diameter of 10 mm, and the Reilly seed crystal had a substantially circular shape and a diameter of 11 mm. The graphite pressing member was allowed to be in contact with the peripheral portion of the seed crystal having a width of about 0.5 mm. For the evaluation items, the surface roughness Ra of the seed crystal after fixation was measured, and the macroscopic defect density and the micro-pipe density were determined. The initial surface roughness Ra of the seed crystal was set at about 0.5 nm. The conditions under which the single crystal was grown were the same as in Example 1.

Figure 4A:
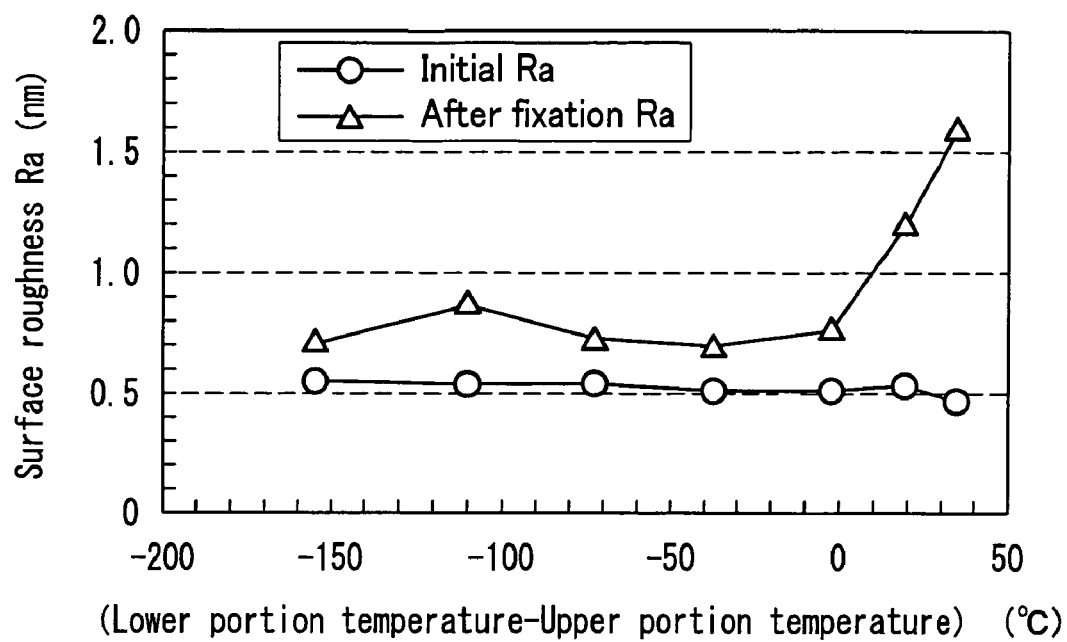
FIGS. 4A and 4B are graphs showing the results of measurements of: surface roughness of a seed crystal obtained after fixation thereof according to Example 2 of the present invention; and densities of micro-pipes generated from the interface between the seed crystal and a growth layer.
Figure 4B:
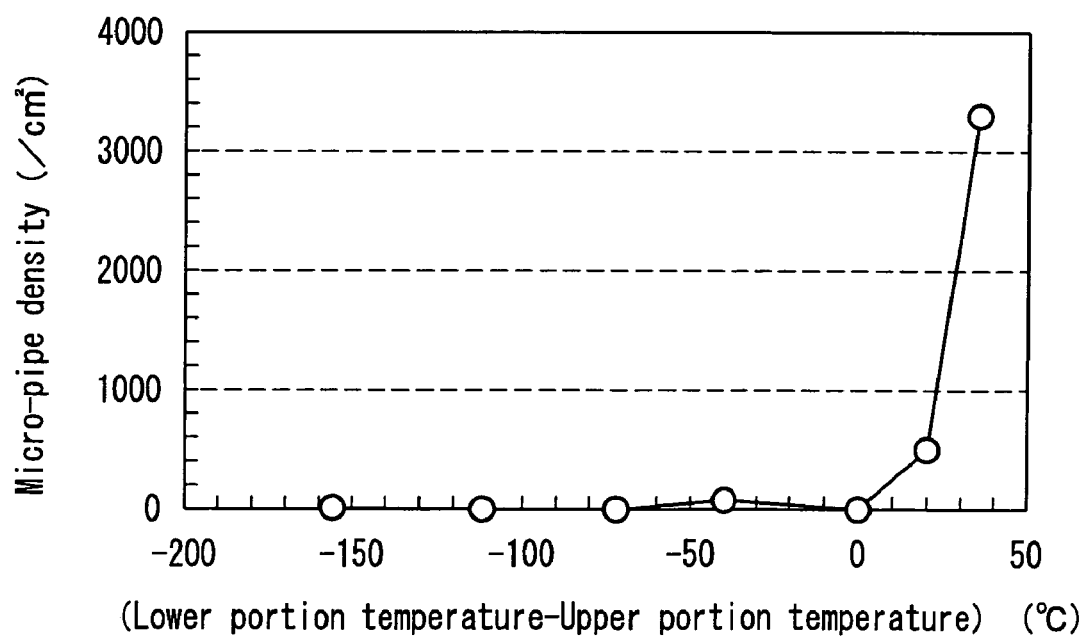
Figure 5:
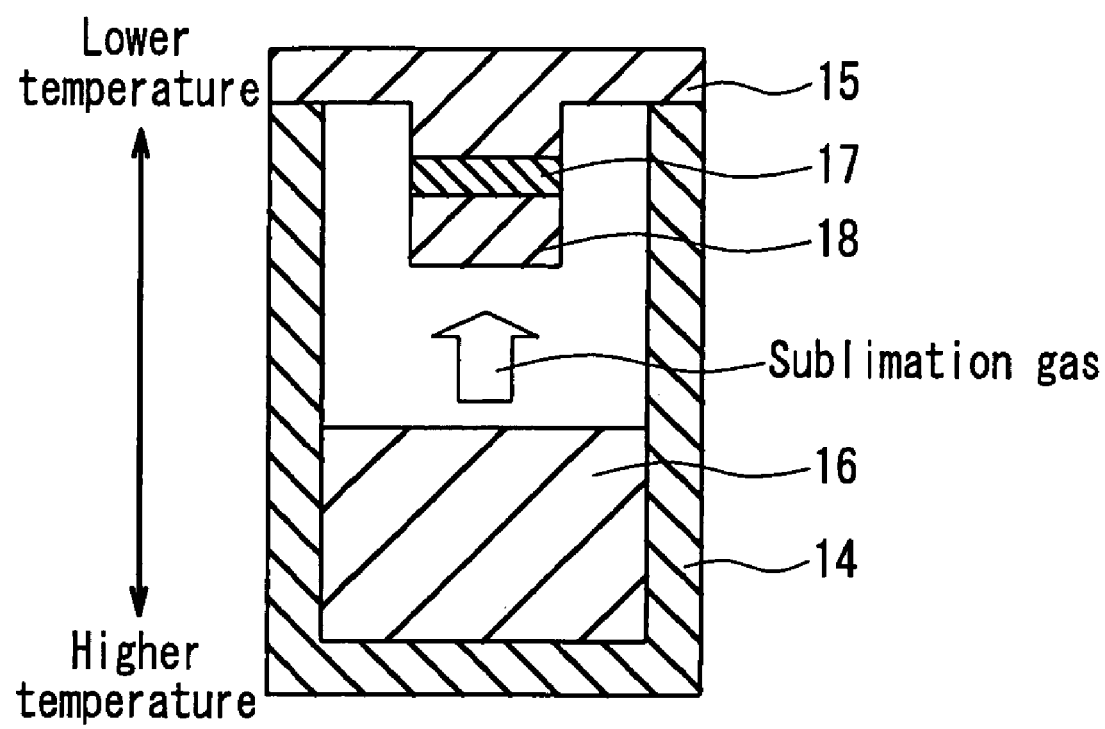
FIG. 5 is a schematic cross sectional view showing a sublimation apparatus used for growing single crystals according to a conventional example.
Figure 6A:
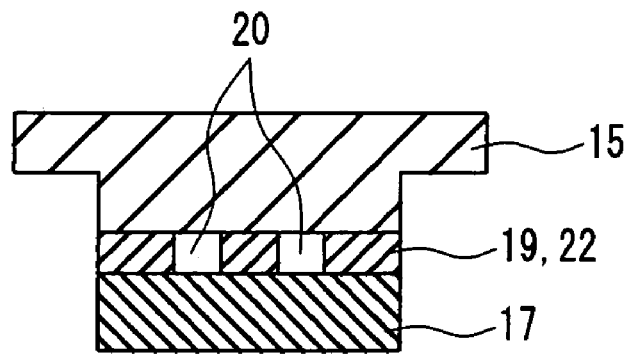
FIGS. 6A to 6C are cross sectional views showing the structure of a seed crystal and a mechanism of producing macroscopic defects according to conventional methods.
Figure 6B:
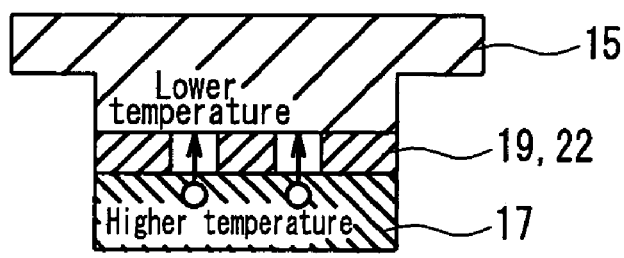
Figure 6C:
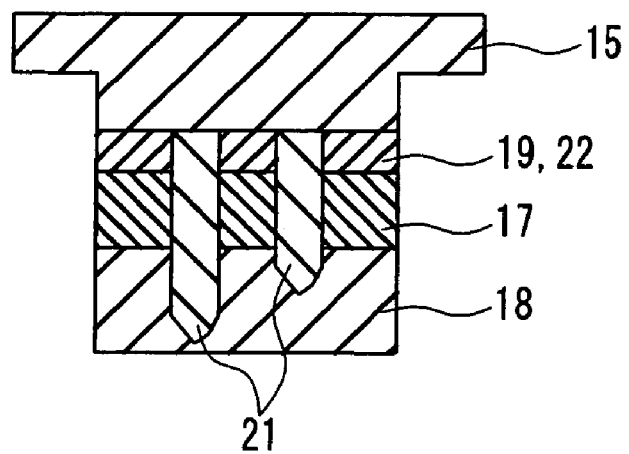
Figure 7A:
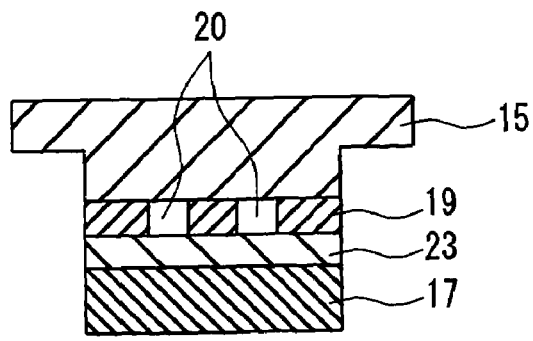
FIGS. 7A to 7C are cross sectional views showing the structure of a seed crystal coated with a protective layer and a mechanism of producing macroscopic defects according to a conventional method.
Figure 7B:
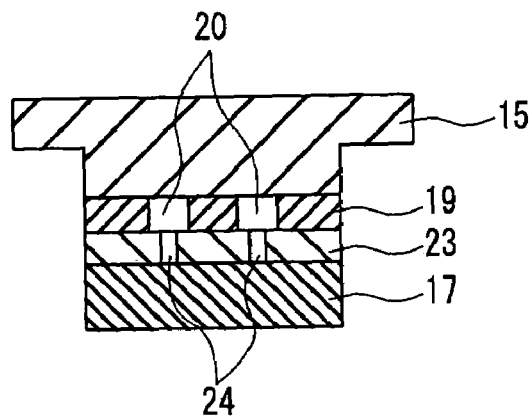
Figure 7C:
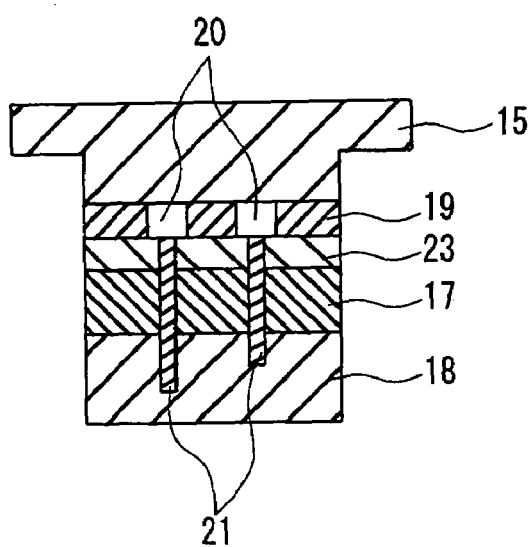

The results are shown in FIGS. 4A and 4B. FIG. 4A shows the results of the measurement of surface roughness after fixation while FIG. 4B shows the results of the measurement of the density of micro-pipes caused from the interface between the seed crystal and the growth layer. Under the condition of (the lower portion temperature−the upper portion temperature)≦0, the surface roughness Ra of the seed crystal was about 0.7 nm after fixation, and this indicates that the surface roughness was reduced. Corresponding to this, the micro-pipe density also decreased sharply under the condition of (the lower portion temperature−the upper portion temperature)≦0, and a micro-pipe density of $50/cm^2$ or lower was obtained. Presumably, this is because under the condition of (the lower portion temperature−the upper portion temperature)>0, a sort of sublimation process using a seed crystal as a raw material takes place to sublimate the seed crystal and thereby roughen the surface due to the lower temperature of the upper portion, while under the condition of (the lower portion temperature−the upper portion temperature)≦0, the contrary occurs and thus the seed crystal is not sublimated. The macroscopic defect density was zero under all the conditions.

Thus, it is optimal to form the pressing member for imposing a load at the time of bonding into a shape that allows the pressing member to be in contact only with at least part of the region of the seed crystal that sticks out from the region of the graphite base that supports the seed crystal, and to set the relationship in temperature between the lower portion of the graphite base and the upper portion of the graphite container to satisfy the condition of (the lower portion temperature−the upper portion temperature)≦0.

As described above, the seed crystal is allowed to have a larger area than that of the region of the graphite base that supports the seed crystal, the pressing member is allowed to be in contact only with at least part of the region of the seed crystal that sticks out from the region of the graphite base that supports the seed crystal, and the relationship in temperature between the lower portion of the graphite base and the upper portion of the graphite container is set to satisfy the condition of (the lower portion temperature−the upper portion temperature)≦0. Thus the development of macroscopic defects that extend in the single crystal grown on the seed crystal can be inhibited considerably and micro-pipes can be prevented from being caused from the interface between the seed crystal and the growth layer.

Example 3

The method of manufacturing a single crystal according to the present invention is described in detail. In this example, a silicon carbide single crystal was grown using the seed crystal that had been fixed in Example 1.

As shown in FIG. 2, a graphite crucible includes the container 5 made of graphite and a graphite base 1 to which the seed crystal has been fixed in Example 1 with the metal carbide layer 11 made of, for instance, titanium carbide. In the lower half of the graphite crucible, SiC powder 12 is provided as a raw material powder. This is covered with the heat insulating member 6 having openings in its top and bottom portions. Thereafter, this is placed in a water-cooled double quartz container 7 whose inner pressure is adjustable. An RF coil 8 and pyrometers 9 and 10 are provided around the double quartz container 7. The RF coil 8 is used for heating the graphite crucible while the pyrometers 9 and 10 are provided on the upper and lower sides of the double quartz container 7 to monitor the temperatures of the graphite base 1 and the container 5 made of graphite. Practically, a fixture for holding the crucible, a vacuum pump that is used for the evacuation of the double quartz container 7, a pressure-regulating valve for adjusting the atmosphere inside the double quartz container 7, etc. also are provided but are omitted herein.

Then the temperature of the double quartz container 7 is raised on the SiC powder 12 side and is lowered on the seed crystal 3 side and thereby sublimation gas is allowed to recrystallize on the seed crystal to grow a silicon carbide single crystal 13. The single crystal 13 is grown using the seed crystal 3 that has been fixed to the graphite base 1 with the metal carbide layer 11 including no voids to form one body therewith, and thereby the single crystal 13 of high quality can be obtained including no macroscopic defects.

A single crystal was allowed to grow on a Reilly seed crystal. The Reilly seed crystal had been fixed to the graphite base by a heat treatment carried out in argon gas atmosphere having a pressure of 93.1 kPa (700 Torr) using 50-μm thick titanium as the metallic material under the conditions including a heating temperature of 1700° C., a heating time of three hours, and a load of 33.5 kPa. The single crystal was grown on this Reilly seed crystal in argon gas atmosphere having a pressure of 3.99 kPa (30 Torr) for 30 hours, with the temperatures being set at 2350° C. and 2200° C. on the SiC powder side and the seed crystal side, respectively. Thus a single crystal whose height was about 8 mm was obtained. This crystal was sliced in parallel to the growth direction, and then the cross section thereof was observed. As a result, no macroscopic defects extending in the grown single crystal that developed from the interface between the seed crystal and the graphite base were observed. In order to check the reproducibility, the same test was carried out ten times and the development of macroscopic defects was inhibited completely nine times.

In addition, as a comparative conventional sample, a single crystal was grown using a seed crystal that had been fixed by a method including bonding a Reilly seed crystal to a graphite base using a resist and then heat-treating it at around 500° C. for three hours to carbonize the resist. The growth conditions were the same as described above. The crystal thus obtained also had the same height, i.e. about 8 mm. The cross section of this crystal was observed. As a result, macroscopic defects extending in the grown single crystal through the seed crystal that developed from the interface between the seed crystal and the graphite base were observed. Using the transmission mode of a microscope for the observation, the macroscopic defect density was measured while the focal point was shifted gradually in the direction of the thickness of the sliced crystal. As a result, the macroscopic defect density was about 970 $cm^{-2}$.

As described above, the metallic material is melted to react with graphite, thereby the seed crystal and the graphite base are bonded to each other using the metal carbide including no voids and having a melting point that is not lower than the single crystal growth temperature, and then the seed crystal thus fixed to the graphite base is used to grow a silicon carbide single crystal. As a result, the development of macroscopic defects can be inhibited and thereby a high-quality single crystal can be obtained.

Example 4

Another method of manufacturing a single crystal according to the present invention is described in detail. In this example, a silicon carbide single crystal was grown using the seed crystal that had been fixed in Example 2. The procedure for growing the single crystal is the same as in Example 3 and therefore the description thereof is not repeated.

A single crystal was allowed to grow on a Reilly seed crystal. The Reilly seed crystal had been fixed to a graphite base by a heat treatment carried out in argon gas atmosphere having a pressure of 93.1 kPa (700 Torr) using 50-μm thick titanium as the metallic material under the conditions including a lower portion temperature of 1700° C., an upper portion temperature of 1740° C., a heating time of three hours, and a load of 33.5 kPa. The single crystal was grown on this Reilly seed crystal in argon gas atmosphere having a pressure of 3.99 kPa (30 Torr) for 30 hours, with the temperatures being set at 2350° C. and 2200° C. on the SiC powder side and the seed crystal side, respectively. Thus a single crystal whose height was about 8 mm was obtained. The seed crystal had a surface roughness Ra of 0.706 nm after being fixed. The single crystal was sliced in parallel to the growth direction, and thereafter the cross section thereof was observed. As a result, no macroscopic defects extending in the grown single crystal that developed from the interface between the seed crystal and the graphite base were observed. Furthermore, a micro-pipe density of about 80/$cm^2$ was obtained in the crystal thus grown since the development of micro-pipes caused by macroscopic defects and those caused by surface roughness from the interface between the seed crystal and the growth layer was inhibited.

As described above, the metallic material is melted to react with graphite, thereby the seed crystal and the graphite base are fixed to each other with the metal carbide including no voids and having a melting point that is not lower than the single crystal growth temperature, and then this seed crystal with no surface roughness is used to grow a silicon carbide single crystal. As a result, the development of macroscopic defects can be inhibited and micro-pipes also can be prevented from developing. Thus a high-quality single crystal can be obtained.

The method of fixing a seed crystal to be used for growing a silicon carbide single crystal and the method of manufacturing a seed crystal using the fixing method according to the present invention can prevent the sublimation from occurring from the rear face of the seed crystal and can inhibit macroscopic defects from being introduced into the grown crystal. Accordingly, the methods also can be used in the case of growing other single crystals that can be grown by the sublimation method, such as cadmium sulfide (CdS), cadmium selenide (CdSe), zinc sulfide (ZnS), aluminum nitride (AlN), boron nitride (BN), etc.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method of fixing a seed crystal to be used for growing a silicon carbide single crystal from the seed crystal that has been fixed to a graphite base, the method comprising:
   forming a layered product by placing a metallic material whose melting point is less than a growth temperature of the single crystal on the graphite base, disposing the seed crystal on the metallic material, and then further placing a pressing member for imposing a load on the seed crystal thereon;
   heat-treating the layered product at a temperature to fix the graphite base, the metallic material, and the seed crystal to each other to form one body, the temperature being not lower than the melting point of the metallic material but not higher than the growth temperature of the single crystal;
   cooling the layered product; and
   then removing the pressing member from the layered product,
   wherein the metallic material is at least one material selected from the group consisting of titanium, vanadium, and zirconium.

2. The method of fixing a seed crystal according to claim 1, wherein the metallic material has a thickness in a range of 20 μm to 200 μm.

3. The method of fixing a seed crystal according to claim 1, wherein in the case of using titanium as the metallic material, the process of heat-treating the layered product employs a heating temperature in a range of 1700° C. to 2000° C.

4. The method of fixing a seed crystal according to claim 1, wherein in the case of using vanadium as the metallic material, the process of heat-treating the layered product employs a heating temperature in a range of 1900° C. to 2200° C.

5. The method of fixing a seed crystal according to claim 1, wherein in the case of using zirconium as the metallic material, the process of heat-treating the layered product employs a heating temperature in a range of 1900° C. to 2200° C.

6. The method of fixing a seed crystal according to claim 1, wherein the process of heat-treating the layered product employs a heating time in a range of 1 to 6 hours.

7. The method affixing a seed crystal according to claim 1, wherein the pressing member has a weight that allows a pressure of 7.84 kPa to 87.5 kPa to be imposed on the seed crystal.

8. The method of fixing a seed crystal according to claim 1, wherein the pressing member is formed of at least one material selected from the group consisting of graphite, tantalum, niobium, molybdenum, tantalum carbide, niobium carbide, and molybdenum carbide.

9. The method affixing a seed crystal according to claim 1, wherein the process of cooling the layered product is carried out by lowering the temperature employed in the process of heat-treating the layered product to 1100° C. at a rate of 5 to 15° C./min and then leaving the layered product at room temperature until the temperature thereof reaches the room temperature.

10. A method of fixing a seed crystal to be used for growing a silicon carbide single crystal from the seed crystal that has been fixed to a graphite base, the method comprising:
   forming a layered product by placing a metallic material whose melting point is less than a growth temperature of the single crystal on the graphite base, disposing the seed crystal on the metallic material, and then further placing a pressing member for imposing a load on the seed crystal thereon;
   heat-treating the layered product, with a container for covering the layered product being disposed on the graphite base, so that a lower portion of the graphite base has a temperature that is not lower than the melting point of the metallic material but is not higher than the growth temperature of the single crystal while a difference in temperature caused between the lower portion of the graphite base and an upper portion of the container is adjusted, and thereby fixing the graphite base, the metallic material, and the seed crystal to each other to form one body;
   cooling the container and the layered product; and
   then removing the container and the pressing member from the layered product,
   wherein the metallic material is at least one material selected from the group consisting of titanium, vanadium, and zirconium.

11. The method of fixing a seed crystal according to claim 10, wherein the seed crystal has a larger area than that of a portion of the graphite base that fixes the seed crystal, and the pressing member has a shape that allows a load to be imposed on the seed crystal, with the pressing member being in contact only with a peripheral portion of the seed crystal.

12. The method of fixing a seed crystal according to claim 11, wherein the peripheral portion of the seed crystal is at least part of a region of the seed crystal that sticks out from an area of the portion of the graphite base that fixes the seed crystal, with the seed crystal being allowed to have a larger area than that of the portion of the graphite base that fixes the seed crystal.

13. The method of fixing a seed crystal according to claim 10, wherein the relationship in temperature between the lower portion of the graphite base and the upper portion of the container satisfies a condition of:
   (Temperature of the Lower Portion−Temperature of the Upper Portion)≦0.

14. The method of fixing a seed crystal according to claim 10, wherein the metallic material has a thickness in a range of 20 μm to 200 μm.

15. The method of fixing a seed crystal according to claim 10, wherein in the case of using titanium as the metallic material, the process of heat-treating the layered product employs a heating temperature that allows the lower portion of the graphite base to have a temperature in a range of 1700° C. to 2000° C.

16. The method of fixing a seed crystal according to claim 10, wherein in the case of using vanadium as the metallic material, the process of heat-treating the layered product employs a heating temperature that allows the lower portion of the graphite base to have a temperature in a range of 1900° C. to 2200° C.

17. The method of fixing a seed crystal according to claim 10, wherein in the case of using zirconium as the metallic material, the process of heat-treating the layered product employs a heating temperature that allows the lower portion of the graphite base to have a temperature in a range of 1900°C. to 2200° C.

18. The method of fixing a seed crystal according to claim 10, wherein the process of heat-treating the layered product employs a heating time in a range of 1 to 6 hours.

19. The method of fixing a seed crystal according to claim 10, wherein the pressing member has a weight that allows a pressure of 7.84 kPa to 87.5 kPa to be imposed on the seed crystal.

20. The method of fixing a seed crystal according to claim 10, wherein the pressing member is formed of at least one material selected from the group consisting of graphite, tantalum, niobium, molybdenum, tantalum carbide, niobium carbide, and molybdenum carbide.

21. The method of fixing a seed crystal according to claim 10, wherein the process of cooling the container and the layered product is carried out by lowering the temperature employed in the process of heat-treating the layered product to 1100° C. at a rate of 5 to 15° C./min and then leaving the layered product at room temperature until the temperature thereof reaches the room temperature.

22. A method of manufacturing a silicon carbide single crystal by supplying sublimation gas generated from a silicon carbide raw material onto a seed crystal held by a graphite base to grow the silicon carbide single crystal on the seed crystal, the seed crystal being obtained by:
   forming a layered product by placing a metallic material whose melting point is less than a growth temperature of the single crystal on the graphite base, disposing the seed crystal on the metallic material, and then further placing a pressing member for imposing a load on the seed crystal thereon;
   heating the layered product at a temperature that is not lower than the melting point of the metallic material but is not higher than the growth temperature of the single crystal;
   cooling the layered product; and then removing the pressing member from the layered product, wherein the metallic material is at least one material selected from the group consisting of titanium, vanadium, and zirconium.

23. A method of manufacturing a silicon carbide single crystal by supplying sublimation gas generated from a silicon carbide raw material onto a seeds crystal held by a graphite base to grow the silicon carbide single crystal on the seed crystal, the seed crystal being obtained by:

forming a layered product by placing a metallic material whose melting point is less than a growth temperature of the single crystal on the graphite base, disposing the seed crystal on the metallic material, and then further placing a pressing member for imposing a load on the seed crystal thereon;

heat-treating the layered product, with a container for covering the layered product being disposed on the graphite base, so that a lower portion of the graphite base has a temperature that is not lower than the melting point of the metallic material but is not higher than the growth temperature of the single crystal while a difference in temperature caused between the lower portion of the graphite base and an upper portion of the container is adjusted, and thereby fixing the graphite base, the metallic material, and the seed crystal to each other to form one body;

cooling the container and the layered product; and then removing the container and the pressing member from the layered product after the process of cooling, wherein the metallic material is at least one material selected from the group consisting of titanium, vanadium, and zirconium.

* * * * *